(12) United States Patent
Seo et al.

(10) Patent No.: US 12,354,663 B2
(45) Date of Patent: Jul. 8, 2025

(54) EMBEDDED FLASH MEMORY AND WRITE OPERATION METHOD THEREOF

(71) Applicant: SK keyfoundry Inc., Cheongju-si (KR)

(72) Inventors: Youngchul Seo, Gwangmyeong-si (KR); Weon-Hwa Jeong, Seoul (KR); Yonghwan Kim, Cheongju-si (KR); Chulgeun Lim, Gunsan-si (KR); Hoon Jin, Cheongju-si (KR); Sungbum Park, Seongnam-si (KR); Keesik Ahn, Hwaseong-si (KR)

(73) Assignee: SK keyfoundry Inc., Cheongju-si (KR)

( * ) Notice: Subject to any disclaimer, the term of this patent is extended or adjusted under 35 U.S.C. 154(b) by 290 days.

(21) Appl. No.: 17/668,884

(22) Filed: Feb. 10, 2022

(65) Prior Publication Data
US 2023/0082379 A1 Mar. 16, 2023

(30) Foreign Application Priority Data

Sep. 10, 2021 (KR) .................. 10-2021-0120871

(51) Int. Cl.
*G11C 16/10* (2006.01)
*G11C 16/04* (2006.01)
(Continued)

(52) U.S. Cl.
CPC .......... *G11C 16/10* (2013.01); *G11C 16/0433* (2013.01); *G11C 16/26* (2013.01);
(Continued)

(58) Field of Classification Search
CPC ... G11C 29/028; G11C 16/10; G11C 16/0433; G11C 16/26; G11C 16/30; G11C 16/32;
(Continued)

(56) References Cited

U.S. PATENT DOCUMENTS

| 5,357,462 | A | * | 10/1994 | Tanaka | ................... | G11C 16/12 |
| | | | | | | 365/185.23 |
| 5,751,637 | A | * | 5/1998 | Chen | ..................... | G11C 16/10 |
| | | | | | | 365/189.05 |

(Continued)

FOREIGN PATENT DOCUMENTS

| KR | 10-2009-0066680 A | 6/2009 |
| KR | 10-2020-0051926 A | 5/2020 |

OTHER PUBLICATIONS

Korean Office Action issued on May 22, 2023, in counterpart Korean Patent Application No. 10-2021-0120871 (7 pages in Korean).

*Primary Examiner* — Uyen Smet
(74) *Attorney, Agent, or Firm* — NSIP Law

(57) ABSTRACT

An embedded flash memory and an operation method thereof is provided. The embedded flash memory includes a memory cell array comprising a plurality of memory cells, an automatic verification controller comprising: a TRIM calibration configured to provide a write voltage, and a time controller configured to control a write time, and a high voltage generator configured to provide the write voltage to the memory cell array, an input buffer configured to store input data, a sense amplifier configured to generate read data from the memory cell array, and a data comparator configured to compare the read data with the input data.

8 Claims, 5 Drawing Sheets

(51) Int. Cl.
    *G11C 16/26*    (2006.01)
    *G11C 16/30*    (2006.01)
    *G11C 16/32*    (2006.01)
    *H10B 41/30*    (2023.01)
    *G11C 16/14*    (2006.01)

(52) U.S. Cl.
    CPC .............. *G11C 16/30* (2013.01); *G11C 16/32* (2013.01); *H10B 41/30* (2023.02); *G11C 16/14* (2013.01)

(58) Field of Classification Search
    CPC ..... G11C 16/14; G11C 29/52; G11C 16/0425; G11C 16/3459; G11C 29/021; H10B 41/40; H10B 41/30
    See application file for complete search history.

(56) References Cited

U.S. PATENT DOCUMENTS

| | | | |
|---|---|---|---|
| 7,889,592 B2 | 2/2011 | Kim | |
| 9,666,291 B2 | 5/2017 | Park | |
| 2006/0039207 A1* | 2/2006 | Combe | G11C 16/3436 365/189.08 |

* cited by examiner

EMBEDDED FLASH MEMORY AND WRITE OPERATION METHOD THEREOF

CROSS-REFERENCE TO RELATED APPLICATIONS

This application claims the benefit under 35 USC § 119(a) of Korean Patent Application No. 10-2021-0120871, filed on Sep. 10, 2021, in the Korean Intellectual Property Office, the entire disclosure of which is incorporated herein by reference for all purposes.

BACKGROUND

1. Field

The following description relates to an embedded flash memory and a write operation method thereof.

2. Description of Related Art

In an embedded flash memory cell, write operations including erasing operations or programing operations may be repeated with write cycles, for example, 1K-1000K, with a high voltage. Accordingly, the high voltage may be applied to a tunneling gate dielectric layer disposed in the embedded flash memory cell. Additionally, the write operation may be performed initially with a large margin write voltage, and then, a read operation may be conducted to determine whether the embedded flash memory cell is programmed or erased. An excessive stress caused by the large margin write voltage may drive the embedded flash memory cell. The tunneling gate dielectric layer may be easily degraded as write cycles are increased. The durability or endurance of the tunneling gate dielectric layer may be deteriorated, so that data read fail and/or data retention fail may occur in the embedded flash memory cell. This may result in the reduction of the number of writing cycles in the embedded flash memory cell.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, an embedded flash memory includes a memory cell array comprising a plurality of memory cells; an automatic verification controller comprising: a TRIM calibration configured to provide a write voltage; and a time controller configured to control a write time, and a high voltage generator configured to receive the write voltage from the TRIM calibration, and provide the write voltage to the memory cell array, an input buffer configured to store input data; a sense amplifier configured to read data from the memory cell array; and a data comparator configured to compare the read data with the input data.

The write voltage may include a minimum write voltage, a maximum write voltage and a write voltage interval.

The automatic verification controller may be configured to provide a TRIM information to the high voltage generator, and the TRIM information may include the write voltage.

Each of the plurality of memory cells may include a source region and a drain region which are disposed in a substrate; a channel region disposed between the source region and the drain region; a tunneling gate dielectric layer formed on the channel region; a floating gate disposed on the tunneling gate dielectric layer; and a control gate dielectric layer and a control gate disposed on the floating gate.

In a general aspect, an embedded flash memory write operation method includes setting each of a plurality of operation parameters with a predetermined value for a write operation; performing the write operation at a write voltage during a write time, wherein the write voltage starts from a minimum write voltage; performing a verify read operation by a data comparator; determining whether a write cycle reaches a maximum write cycle; determining whether the write voltage reaches a maximum write voltage; elevating the write voltage by a write voltage interval; and repeating the write operation at the elevated write voltage.

The verify read operation may be performed regardless whether a read data matches an input data.

The operation parameters may include at least one of the minimum write voltage, the maximum write voltage, the write voltage interval, the write time, and the maximum write cycle, and the write operation may include a data erase operation and a data programming operation.

The read data and the input data may be respectively provided from a sense amplifier and an input buffer disposed in the embedded flash memory.

When read data and the input data are not equal to each other, the data comparator may be configured to generate a 'fail' signal to an automatic verification controller, when the read data and the input data are equal to each other, the data comparator may be configured to generate a 'pass' signal to the automatic verification controller, and the write operation may be terminated when the 'pass' signal is generated.

In the determining of whether the write cycle reaches the maximum write cycle, when the write cycle has not reached the maximum write cycle, the write operation may be performed again.

In the determining of whether the write voltage reaches the maximum write voltage, when the write voltage has not reached the maximum write voltage, the write operation may be performed again, and when the write voltage reaches the maximum write voltage, the write operation may be terminated.

In a general aspect, an embedded flash memory includes a memory cell array; an automatic verification controller, configured to control a write voltage for a write operation, and configured to control a write time for the write operation; a high voltage generator configured to receive the write voltage, and provide one or more of a program voltage, erase voltage, read voltage to memory cells of the memory cell array; a sense amplifier configured to read data from the memory cell array; an input buffer configured to receive input data, and a comparator configured to compare the read data and the input data, generate a verification signal based on the comparing, and provide the verification signal to the automatic verification controller, wherein subsequent write operations are performed based on the verification signal.

The write operation may include one or more of a data erase operation and a data programming operation.

The verification signal may include a "pass" signal, which indicates that the input data and the read data are the same, and a "fail" signal, which indicates that the input data and the read data are not the same.

The write operation may be terminated when the "pass" signal is generated.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
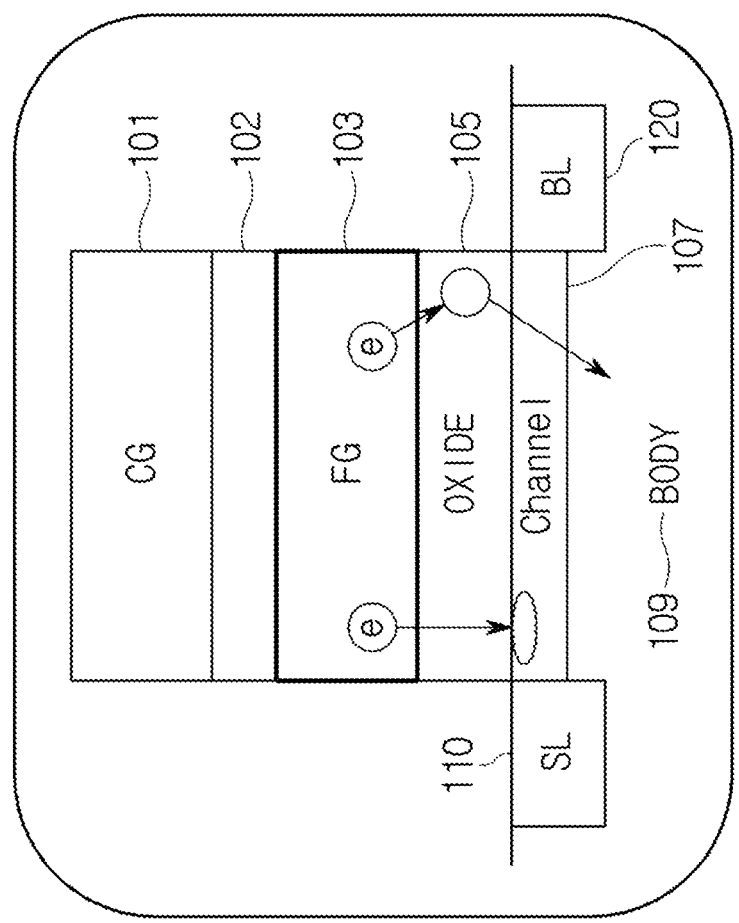
FIG. 1 illustrates an example structure of a memory cell of an example embedded flash memory, in accordance with one or more embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness, noting that omissions of features and their descriptions are also not intended to be admissions of their general knowledge.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Throughout the specification, when an element, such as a layer, region, or substrate is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

The terminology used herein is for the purpose of describing particular examples only, and is not to be used to limit the disclosure. As used herein, the singular forms "a," "an," and "the" are intended to include the plural forms as well, unless the context clearly indicates otherwise. As used herein, the term "and/or" includes any one and any combination of any two or more of the associated listed items. As used herein, the terms "include," "comprise," and "have" specify the presence of stated features, numbers, operations, elements, components, and/or combinations thereof, but do not preclude the presence or addition of one or more other features, numbers, operations, elements, components, and/or combinations thereof.

In addition, terms such as first, second, A, B, (a), (b), and the like may be used herein to describe components. Each of these terminologies is not used to define an essence, order, or sequence of a corresponding component but used merely to distinguish the corresponding component from other component(s).

Unless otherwise defined, all terms, including technical and scientific terms, used herein have the same meaning as commonly understood by one of ordinary skill in the art to which this disclosure pertains and after an understanding of the disclosure of this application. Terms, such as those defined in commonly used dictionaries, are to be interpreted as having a meaning that is consistent with their meaning in the context of the relevant art and the disclosure of this application, and are not to be interpreted in an idealized or overly formal sense unless expressly so defined herein.

Also, in the description of example embodiments, detailed description of structures or functions that are thereby known after an understanding of the disclosure of the present application will be omitted when it is deemed that such description will cause ambiguous interpretation of the example embodiments.

Hereinafter, examples will be described in detail with reference to the accompanying drawings, and like reference numerals in the drawings refer to like elements throughout.

FIG. 1 illustrates an example structure of a memory cell of an example embedded flash memory, in accordance with one or more embodiments.

Referring to FIG. 1, the example embedded flash memory may include a control gate CG 101, a control gate dielectric layer 102, a floating gate FG 103, a tunneling gate dielectric layer 105, a channel 107, a body region (or well region) 109, a source line SL 110, and a bit line BL 120. The tunneling gate dielectric layer 105 may comprise a thin oxide layer. The floating gate FG 103 may be disposed between the control gate CG 101 and the tunneling gate dielectric layer 105, and may store or discharge electrons depending on applied voltages to the control gate CG 101 and the body region 109. The electrons may move between the channel 107 and the floating gate FG 103 through the tunneling gate dielectric layer 105. When a positive high voltage is applied to the body region BODY 109, the electrons may move from the floating gate FG 103 to the channel 107. In that example, data of the corresponding memory cell may be erased. Specifically, the movement of the electrons from the floating gate FG 103 to the channel 107 means that an erase operation has occurred. When a positive high voltage is applied to the control gate CG, the electrons may charge or move from the body region 109 to the floating gate FG 103. In that example, data may be stored in the corresponding memory cell. Specifically, movement of the electrons from the body region 109 to the floating gate FG 103 means that a program operation has occurred. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

Figure 2:
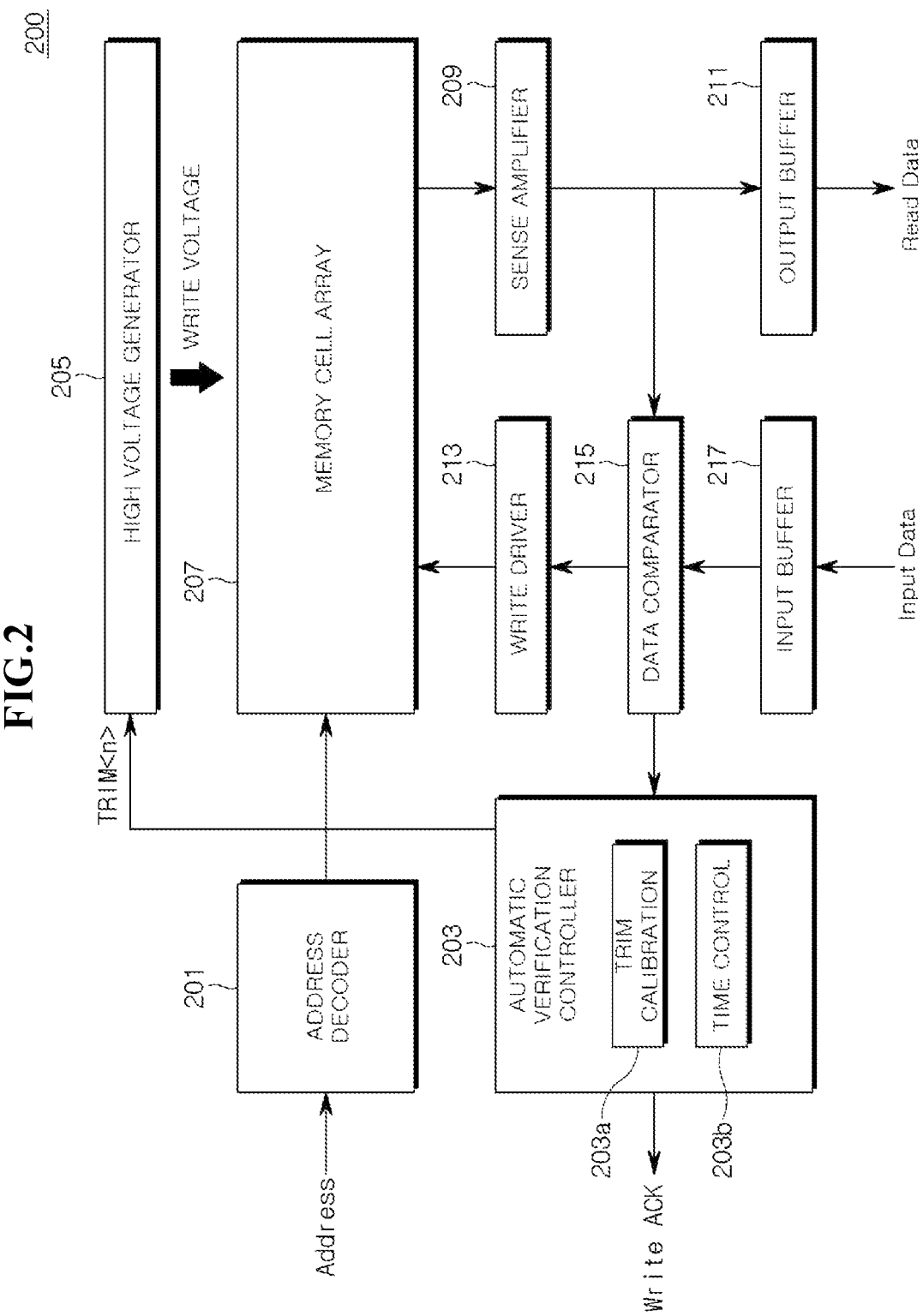
FIG. 2 illustrates a block diagram of an example embedded flash memory, in accordance with one or more embodiments.

FIG. 2 illustrates a block diagram of an example embedded flash memory, in accordance with one or more embodiments.

Referring to FIG. 2, the example embedded flash memory or eFlash memory or eFlash IP 200 may include an address decoder 201, an automatic verification controller 203, a high voltage generator 205, a memory cell array or eFlash Cell Array 207, a sense amplifier or a sense AMP 209, an output buffer 211, a write driver 213, a data comparator 215, and an input buffer 217.

In an example, the address decoder 201 may comprise a row address decoder and a column address decoder. In implementing the row address decoder, one row of the memory cell array 207 may be selected. In implementing the column address decoder, one column of the memory cell array 207 may be selected.

In an example, the automatic verification controller 203 may comprise a TRIM calibration 203a, which is configured to set, change or calibrate a write voltage for the write or erase operations, for example, the programming operation or the erase operation. The write voltage may be determined to minimize a number of electrons tunneling into the tunneling gate dielectric layer 105 in FIG. 1. Since the write voltage may be small, a damage on the tunneling gate dielectric layer 105 may be minimized. Then, the cycling or data retention performance may be increased in the eFlash cell 207. The automatic verification controller 203 may further comprise a time control 203b configured to control a write time for the write operation. The time control 203b may control a maximum write cycle, in addition to a write time. As the number of write cycles increase, the total write time may also increase. The automatic verification controller 203 may provide TRIM<n> information to the high voltage generator 205. TRIM<n> information may include at least a write voltage to be applied to the embedded memory cell disposed in the memory cell array 207.

In an example, the high voltage generator 205 may receive the TRIM<n> information from the automatic verification controller 203. The high voltage generator 205 may provide a program voltage, erase voltage, read voltage, etc., to the memory cell array 207 based on the TRIM<n> information.

In an example, the memory cell array 207 may include a plurality of memory cells, a plurality of word lines and a plurality of bit lines. Each of the memory cells may be located at a point where the word lines and the bit lines intersect. Data write operations or data read operations may be performed on the memory cells of the memory cell array 207, based on a high voltage supplied from the high voltage generator 205. A write operation may include a data erase operation and/or a data programming operation. In an example, for a data programming operation, a program voltage may be applied to a specified memory cell, and then data may be stored as stored data in the specified memory cell of the memory cell array 207. In an example, for a data erase operation, an erase voltage may be applied to the specified memory cell, and then the stored data may be erased in the specified memory cell. In an example, the data read operation may read the stored data in the specified memory cell.

In an example, the sense amplifier 209 may read the stored data in the memory cell corresponding to the specified address among the memory cells included in the memory cell array 207. The sense amplifier 209 may be connected to the bit lines connected to the memory cell array 207. The sense amplifier 209 may sense and amplify a potential difference between a specified bit line BL and a reference voltage bit line which may be connected to a reference voltage generator. When the write operation is performed in the memory cell corresponding to the specified address, the sense amplifier 209 may read the stored data or the erased data of the memory cell corresponding to the specified address and may provide the read data to the output buffer 211 and the data comparator 215.

In an example, the output buffer 211 may output the read data received from the sense amplifier 209 to an external device (e.g., a memory controller).

In an example, a write driver 213 may provide input data to the memory cell array 207.

In an example, the data comparator 215 may receive the read data from the sense amplifier 209, and input data from the input buffer 217, and may compare the input data with the read data. The data comparator 215 may perform a verification process based on the compared read data and input data, and may transmit a verification "pass" signal or a verification "fail" signal to the automatic verification controller 203. When the input data received from the input buffer 217 and the read data received from the sense amplifier 209 are the same, the data comparator 215 may output a verification pass signal, 'pass'. When the input data received from the input buffer 217 and the read data received from the sense amplifier 209 are not the same, the data comparator 215 may output a verification failure signal, 'fail'.

In an example, the input buffer 217 may store input data received from the external device (e.g., a memory controller), and may provide the received input data to the data comparator 215. The input data may be transferred to the write driver 213.

The write voltage may comprise a minimum write voltage, a maximum write voltage and a write voltage interval. In an example, the write voltage may be selected to minimize the damage on the tunneling gate dielectric layer 105 in the embedded flash memory cell. The write voltage may be based on the non-volatile memory (NVM) cell structure, such as a thickness of the tunneling gate dielectric layer 105, program operation voltage or an erase operation voltage, as only examples.

In a non-limiting example, the write voltage may be 12.5 V, 12.8 V, 13.1 V, 13.4 V, 13.7 V, 14.0 V, 14.3 V, and 14.6 V for the erase operation. In a non-limiting example, the write voltage may be 15.5 V, 15.8 V, 16.1 V, 16.4 V, 16.7 V, 17.0 V, 17.3V, and 17.6 V for the program operation. In an example, in order to minimize stress caused by the write voltage, the automatic verification controller 203 may start from a minimum write voltage at which the write operation (erase/program) can be performed. In an example, the minimum write voltage at which the erase operation can be performed may be 12.5 V, and the minimum write voltage at which the program operation can be performed may be 15.5 V. The above-described minimum write voltage values are merely examples for understanding, and various examples are not limited thereto.

Figure 3:
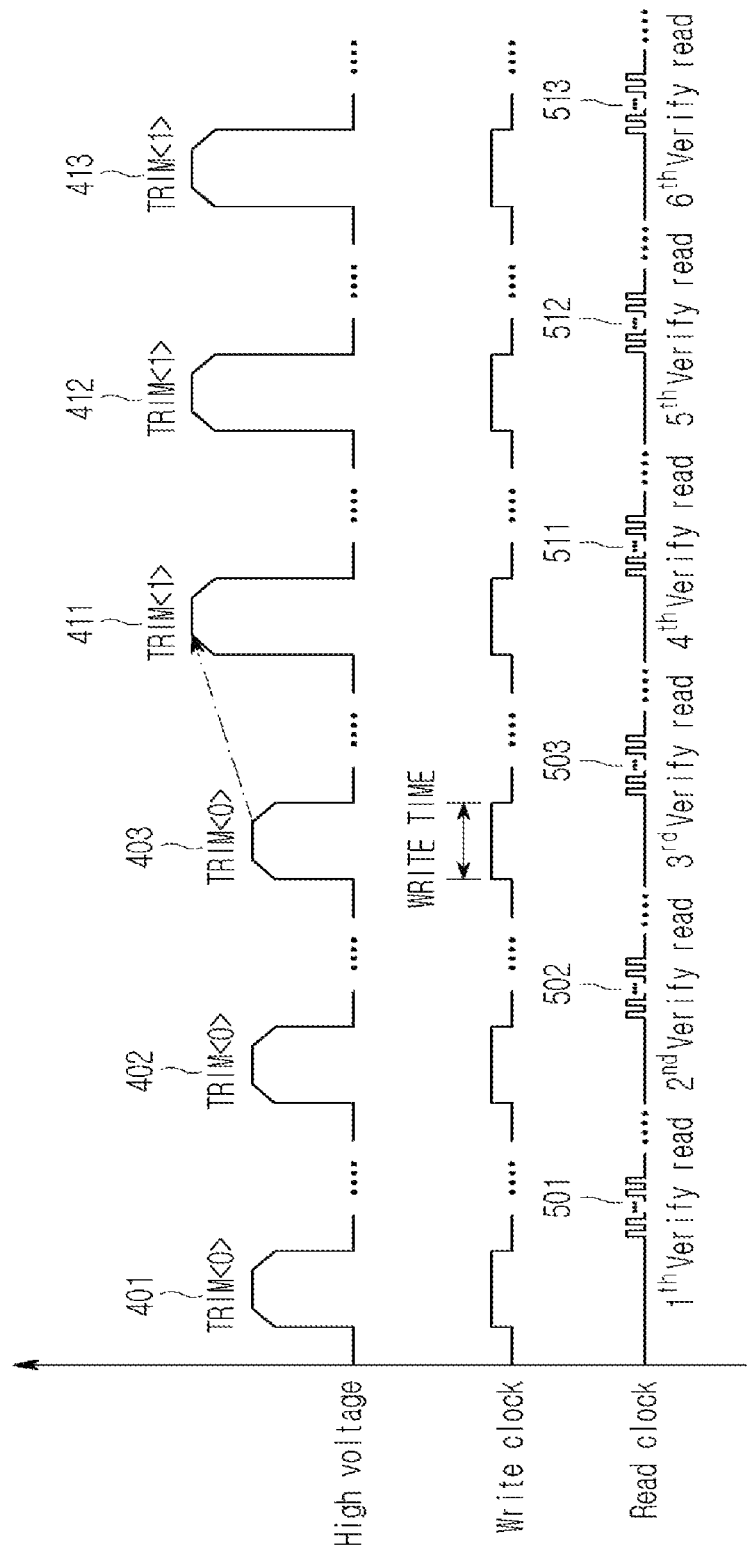
FIGS. 3 and 4 illustrate a timing diagram for a write operation in an example embedded flash memory, in accordance with one or more embodiments.
Figure 4:
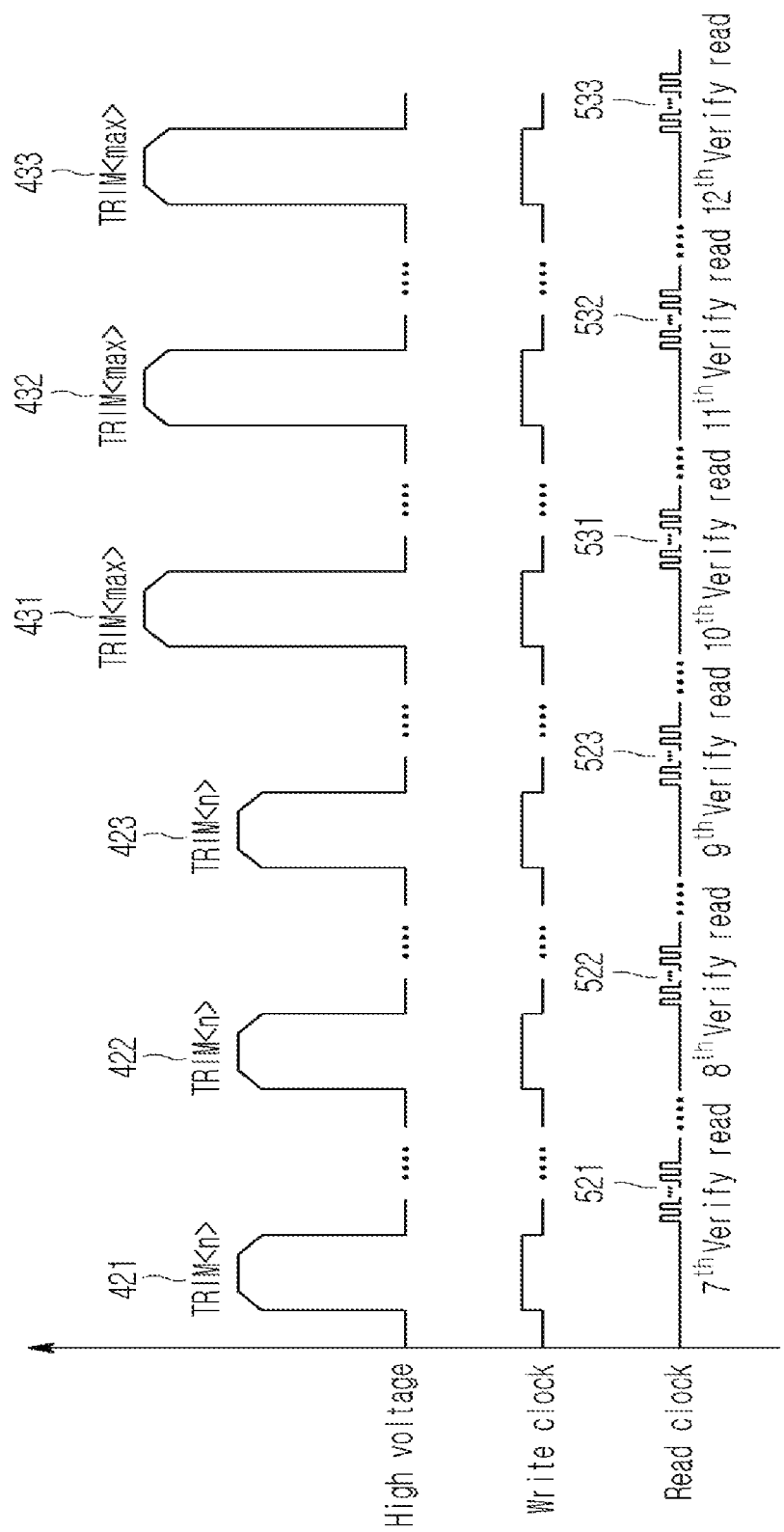

FIGS. 3 and 4 illustrate a timing diagram for a write operation in an example embedded flash memory, in accordance with one or more examples.

In an example, an erase operation implemented as the write operation may be explained in FIGS. 3 and 4.

Referring to FIG. 3, when a write clock is detected, the embedded flash memory 200 may start a first write operation at a first write voltage according to the TRIM <0> 401. The first write voltage may be the minimum write voltage. In an example, the first write voltage, for example, 12.5 V, may be applied to the memory cell during a write time, for example, 30 μsec. In this example, the first write voltage and the write time may be respectively set at 12.5 V and 30 μsec. As discussed above, parameters such as the write voltage and the write time may be controlled in the automatic verification controller 203.

Referring to FIG. 3, after the first write operation is performed, the embedded flash memory 200 may perform a first verify read operation 501 to read the stored data in the memory cell by implementing the sense amplifier 209, such that read data is produced and the read data is transferred to the data comparator 215. When the read data is different from the input data, the data comparator 215 may provide a "fail" signal to the TRIM calibration 203a.

Referring to FIG. 3, the embedded flash memory 200 may perform a second write operation at the first write voltage for 30 μsec according to the TRIM <0> (402). When the second verify read operation 502 is again a "fail" result, the embedded flash memory 200 may perform a third write operation at the first write voltage for 30 μsec according to the TRIM <0> (403). When the third verify read operation 503 is again a "fail" operation, the maximum write cycle is satisfied. In this example, the maximum write cycle is three.

It has been described in the above description that, in an example, the write operations may be performed up to three write operations. However, this is only an example, and the write operation may be repeatedly conducted up to 50 cycles based on a write operation condition. In an example, write time may be changed from 5 μsec to 50 μsec based on the write operation condition. When the result of the third verify read operation 503 is a "pass" result, the embedded flash memory 200 may terminate the write cycle.

Referring to FIG. 3, if the verify read operation is a failure result, even though the write operation is performed up to the maximum write cycle, the embedded flash memory 200 may increase the write voltage.

Referring to FIG. 3, the embedded flash memory 200 may perform a $4^{th}$ write operation at a second write voltage, for example, 13.1V, for 30 μsec according to TRIM <1> (411). After performing the $4^{th}$ write operation, the embedded flash memory 200 may perform a fourth verify read operation 511.

Referring to FIG. 3, when the $4^{th}$ verify read operation 511 is a "fail" operation, a $5^{th}$ write operation and a $5^{th}$ verify read operation 512 may be performed according to TRIM <1> (412) at the second write voltage for the same write time.

Referring to FIG. 3, when the $5^{th}$ verify read operation is a "fail" operation, a $6^{th}$ write operation and a $6^{th}$ verify read operation 513 may be performed according to TRIM <1> (413) at the second write voltage for the same write time.

Referring to FIG. 4, if the $6^{th}$ verify read operation 512 results in a "fail" operation as illustrated in FIG. 3, the write operations are repeated at an increased write voltage for the same write time according to TRIM <n> (421), TRIM <n> (422), and TRIM <n> (423). In an example, the increased write voltage may be any one of 13.4 V, 13.7 V, 14.0 V, 14.3 V, and 14.6 V. The embedded flash memory 200 may terminate the write operation when the verify read operation is results in a "pass" result.

Referring to FIG. 4, each of write operations may be performed, the verify read operation may be conducted. In an example, $7^{th}$, $8^{th}$, and $9^{th}$ verify read operations 521, 522, and 523 may be performed.

In an example, when the verify read continuously fails, the embedded flash memory 200 may repeatedly perform a process of performing the write operation again until maximum write voltage.

Referring to FIG. 4, the write operations may be performed based on TRIM <max> (431), TRIM <max> (432), and TRIM <max> (433). Additionally, the embedded flash memory 200 may perform a tenth, an eleventh, and a twelfth verify read operation 531, 532, and 533 for the TRIM <max> (431), TRIM <max> (432), and TRIM <max> (433), respectively. Each of the TRIM <max> (431), TRIM <max> (432), and TRIM <max> (433) may be performed at the maximum write voltage.

In an example, a program operation as the write operation may be performed in the same manner as the erase operation described in FIGS. 3 and 4. In an example, the program operation may be performed at 15.5 V, which is a first write voltage for write time. In an example, the write time may be 5 μsec, 10 μsec, 30 μsec, 50 μsec, etc. A verify read operation may be performed to verify whether the memory cell is programed or not. If the verify read operation is a "fail" result, the write voltage may be increased by a predetermined voltage level. The embedded flash memory 200 may repeat this operation to increase the write voltage for the program operation at a predetermined interval, for example, 0.3V. In an example, the increased write voltage may be 15.8V, 16.1 V, 16.4 V, 16.7 V, 17.0 V, 17.3 V, and 17.6 V. The embedded flash memory 200 may terminate the write cycle, when the verify read operation is a "pass" result.

In an example, a voltage for the write operation in the embedded flash memory may be controlled, so that damage of the tunneling gate dielectric layer can be minimized, and the durability of the tunneling gate dielectric layer may be prevented from being deteriorated. Additionally, the number of write cycles may be increased, and data retention characteristics can be improved.

Figure 5:
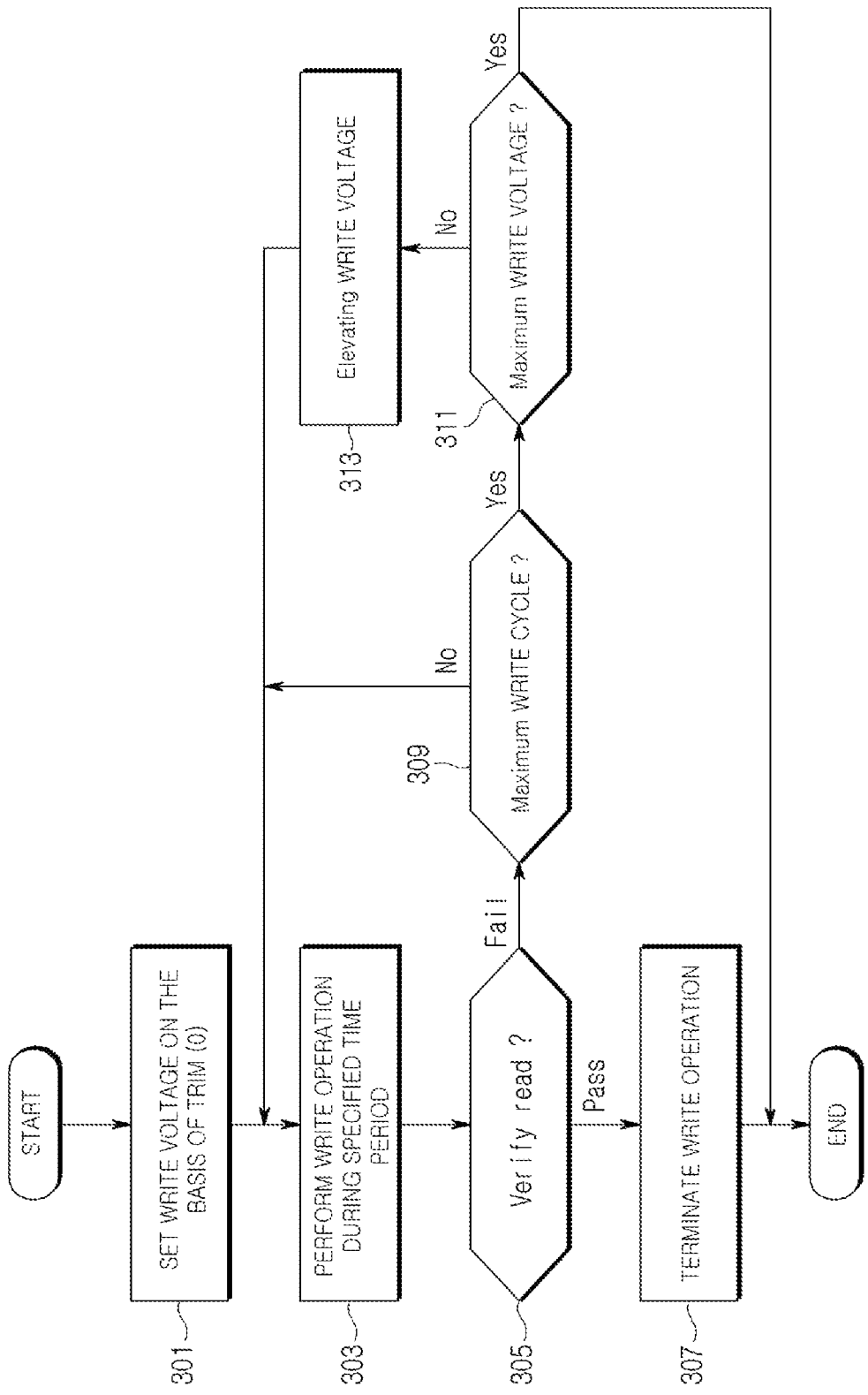
FIG. 5 illustrates a flowchart of a write operation in an example embedded flash memory, in accordance with one or more embodiments.

FIG. 5 illustrates a flowchart of the write operation in the embedded flash memory, in accordance with one or more embodiments. In an example, the embedded flash memory may be the embedded flash memory 200 of FIG. 2.

Referring FIG. 5, in operation 301, several parameters may be selected for the write operation. TRIM <0> provides a predetermined minimum write voltage, a predetermined maximum write voltage, a predetermined write voltage interval, a predetermined write time, and/or a predetermined maximum write cycle. The write operation may include a data erase operation and/or a data programming operation. In an example, the minimum write voltage, the write time, and the maximum write cycle may be respectively set to 12.5V, 30 μsec and 15 for the erase operation. The minimum write voltage for the program operation may be selected as 15.5V. The above-described minimum write voltages are merely examples, and the one or more examples are not limited thereto.

In operation 303, the write operation may be performed at the predetermined write voltage for the predetermined write time selected in operation 301.

In operation 305, the verify read operation may be performed through the data comparator 215 whether the read data matches the input data or not. The read data may be received from the sense amplifier 209 in the embedded flash memory 200. The input data may be provided from the input buffer 217. When the read data and the input data are not equal to each other, the determined result may be a 'fail' result. When the read data and the input data are equal to each other the determined result may be a 'pass' result and then, the write operation is terminated.

In operation 309, a write cycle is checked to determine whether the write cycle reaches the maximum write cycle or not. If the write cycle has not reached the maximum write cycle, the operation returns to the write operation 303. If the write voltage reaches the maximum write voltage, the operation proceeds to operation 311.

In operation 311, the write voltage is checked to determine whether the write voltage reaches the maximum write voltage. If the write voltage has not reached the maximum write voltage, the operation proceeds to operation 303. If the write voltage reaches the maximum write voltage, then the write operation is terminated with a 'fail' determination result. If the read data and the input data in the verification process are not equal to each other at the maximum write voltage and the maximum write cycle, a determination result may be a 'fail' result.

In operation 313, the embedded flash memory 200 may elevate the write voltage from the starting WRITE VOLTAGE. The write operation 303 at an elevated write voltage may be performed. The write voltage may be increased by a predetermined write voltage interval, for example, 0.3 V. The write cycle may be repeated until the write operation achieves a 'pass' result.

In order to minimize the stress of the tunneling gate dielectric layer 105, the write operations including erase/program operations may be started at the minimum write voltage. Since a write voltage as low as possible may be applied to the memory cell, damage of the tunneling gate dielectric layer may be minimized. Accordingly, the number of cycles of the embedded flash memory may be increased, and data retention characteristics may be improved.

The flash memory, as well as the remaining apparatuses, units, modules, devices, and other components, described herein may be implemented by hardware components and software components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An embedded flash memory, comprising:
   a memory cell array comprising a plurality of memory cells;
   an automatic verification controller comprising:
      a TRIM calibration configured to provide a write voltage; and
      a time controller configured to control a write time and a maximum write cycle, and
      a high voltage generator configured to receive the write voltage from the TRIM calibration, and provide the write voltage to the memory cell array,
   an input buffer configured to store input data;
   a sense amplifier configured to read data from the memory cell array; and
   a data comparator configured to compare the read data with the input data,
   wherein in response to the read data not matching the input data, and in response to the maximum write cycle not being reached, a same write voltage is provided to the memory cell array for a same write time, and
   in response to the maximum write cycle being reached, another same write voltage is provided to the memory cell array for the same write time for another maximum write cycle.

2. The embedded flash memory of claim 1,
   wherein the write voltage comprises a minimum write voltage, a maximum write voltage and a write voltage interval.

3. The embedded flash memory of claim 1,
   wherein the automatic verification controller is configured to provide a TRIM information to the high voltage generator, and
   wherein the TRIM information comprises the write voltage.

4. The embedded flash memory of claim 1, wherein each of the plurality of memory cells comprises:
   a source region and a drain region which are disposed in a substrate;
   a channel region disposed between the source region and the drain region;
   a tunneling gate dielectric layer formed on the channel region;
   a floating gate disposed on the tunneling gate dielectric layer; and
   a control gate dielectric layer and a control gate disposed on the floating gate.

5. An embedded flash memory, comprising:
   a memory cell array;
   an automatic verification controller, configured to control a write voltage for a write operation, and configured to control a write time and a maximum write cycle for the write operation;
   a high voltage generator configured to receive the write voltage, and provide one or more of a program voltage, erase voltage, read voltage to memory cells of the memory cell array;
   a sense amplifier configured to read data from the memory cell array;
   an input buffer configured to receive input data, and
   a comparator configured to compare the read data and the input data, generate a verification signal based on the comparing, and provide the verification signal to the automatic verification controller,
   wherein subsequent write operations are performed based on the verification signal with a same write time and a same write voltage up to the maximum write cycle, and
   after the maximum write cycle, performed based on another same write voltage and the same write time up to another maximum write cycle.

6. The embedded flash memory of claim 5, wherein the write operation comprises one or more of a data erase operation and a data programming operation.

7. The embedded flash memory of claim 5, wherein the verification signal comprises a "pass" signal, which indicates that the input data and the read data are the same, and a "fail" signal, which indicates that the input data and the read data are not the same.

8. The embedded flash memory of claim 7, wherein the write operation is terminated when the "pass" signal is generated.

* * * * *